(12) United States Patent
Das et al.

(10) Patent No.: US 9,337,795 B2
(45) Date of Patent: May 10, 2016

(54) SYSTEMS AND METHODS FOR GAIN CALIBRATION OF AN AUDIO SIGNAL PATH

(71) Applicant: Cirrus Logic, Inc., Austin, TX (US)

(72) Inventors: Tejasvi Das, Austin, TX (US); Xin Zhao, Austin, TX (US); Ted Burk, Cedar Park, TX (US); Ku He, Austin, TX (US); John L. Melanson, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 15 days.

(21) Appl. No.: 14/481,201

(22) Filed: Sep. 9, 2014

(65) Prior Publication Data

US 2016/0072465 A1 Mar. 10, 2016

(51) Int. Cl.
| | | |
|---|---|---|
| *H03F 99/00* | (2009.01) | |
| *H03G 3/20* | (2006.01) | |
| *H03G 3/00* | (2006.01) | |
| *H04R 29/00* | (2006.01) | |

(52) U.S. Cl.
CPC ............ *H03G 3/20* (2013.01); *H03G 3/001* (2013.01); *H03G 3/002* (2013.01)

(58) Field of Classification Search
CPC .......... H03G 3/001; H03G 3/002; H03G 3/20
USPC ........ 381/101, 107, 57, 58, 60; 330/278, 279; 341/144, 145, 139
See application file for complete search history.

(56) References Cited

U.S. PATENT DOCUMENTS

| | | |
|---|---|---|
| 4,446,440 A | 5/1984 | Bell |
| 4,972,436 A | 11/1990 | Halim et al. |
| 4,999,628 A | 3/1991 | Kakubo et al. |
| 4,999,830 A | 3/1991 | Agazzi |
| 5,148,167 A | 9/1992 | Ribner |
| 5,321,758 A | 6/1994 | Charpentier et al. |

(Continued)

FOREIGN PATENT DOCUMENTS

| | | |
|---|---|---|
| EP | 0966105 A2 | 12/1999 |
| EP | 1753130 A1 | 10/2005 |

(Continued)

OTHER PUBLICATIONS

Thaden, Rainer et al., A Loudspeaker Management System with FIR/IRR Filtering; AES 32nd International Conference, Hillerod, Denmark, Sep. 21-23, 2007; pp. 1-12.

(Continued)

*Primary Examiner* — Vivian Chin
*Assistant Examiner* — Ammar Hamid
(74) *Attorney, Agent, or Firm* — Jackson Walker L.L.P.

(57) ABSTRACT

A signal path may operate in one of a plurality of gain modes such that for each gain mode, the product of a digital gain and an analog signal gain of the signal path associated with the particular gain mode are approximately equal to a fixed path gain. During each of one or more calibration phases, a calibration system may measure analog signals at a plurality of nodes of the first path portion, calculate an actual analog gain associated with the gain mode based on the analog signals measured at the plurality of nodes, calculate an error between the fixed path gain and a mathematical product of the actual analog gain associated with the gain mode and the digital gain associated with the gain mode, and modify at least one of the digital gain and the analog gain associated with the gain mode in conformity with the error.

24 Claims, 3 Drawing Sheets

(56) References Cited

U.S. PATENT DOCUMENTS

| | | |
|---|---|---|
| 5,323,159 A | 6/1994 | Imamura et al. |
| 5,600,317 A | 2/1997 | Knoth et al. |
| 5,714,956 A | 2/1998 | Jahne et al. |
| 6,088,461 A | 7/2000 | Lin |
| 6,201,490 B1 | 3/2001 | Kawano et al. |
| 6,271,780 B1 | 8/2001 | Gong et al. |
| 6,768,443 B2 | 7/2004 | Willis |
| 6,853,242 B2 | 2/2005 | Melanson et al. |
| 7,023,268 B1 | 4/2006 | Taylor et al. |
| 7,061,312 B2 | 6/2006 | Andersen et al. |
| 7,167,112 B2 | 1/2007 | Andersen et al. |
| 7,216,249 B2 | 5/2007 | Fujiwara et al. |
| 7,403,010 B1 | 7/2008 | Hertz |
| 7,522,677 B2 | 4/2009 | Liang |
| 7,583,215 B2 | 9/2009 | Yamamoto et al. |
| 8,060,663 B2 | 11/2011 | Murray et al. |
| 8,289,425 B2 | 10/2012 | Kanbe |
| 8,330,631 B2 | 12/2012 | Kumar et al. |
| 8,362,936 B2 | 1/2013 | Ledzius et al. |
| 8,717,211 B2 | 5/2014 | Miao et al. |
| 9,071,267 B1 | 6/2015 | Schneider et al. |
| 9,071,268 B1 | 6/2015 | Schneider et al. |
| 9,148,164 B1 | 9/2015 | Schneider et al. |
| 2004/0184621 A1 | 9/2004 | Andersen et al. |
| 2006/0056491 A1 | 3/2006 | Lim et al. |
| 2007/0057720 A1 | 3/2007 | Hand et al. |
| 2007/0092089 A1 | 4/2007 | Seefeldt et al. |
| 2008/0159444 A1 | 7/2008 | Terada |
| 2009/0021643 A1 | 1/2009 | Hsueh et al. |
| 2009/0058531 A1 | 3/2009 | Hwang et al. |
| 2009/0220110 A1* | 9/2009 | Bazarjani .............. H03F 1/0211 381/120 |
| 2011/0025540 A1 | 2/2011 | Katsis |
| 2011/0096370 A1 | 4/2011 | Okamoto |
| 2011/0170709 A1 | 7/2011 | Guthrie et al. |
| 2011/0242614 A1 | 10/2011 | Okada |
| 2012/0133411 A1* | 5/2012 | Miao .................... H03G 3/001 327/306 |
| 2012/0177226 A1 | 7/2012 | Silverstein et al. |
| 2012/0188111 A1 | 7/2012 | Ledzius et al. |
| 2012/0242521 A1 | 9/2012 | Kinyua |
| 2012/0280726 A1 | 11/2012 | Colombo et al. |
| 2013/0106635 A1 | 5/2013 | Doi |
| 2013/0188808 A1 | 7/2013 | Pereira et al. |
| 2014/0184332 A1 | 7/2014 | Shi et al. |
| 2015/0295584 A1 | 10/2015 | Das et al. |
| 2015/0381130 A1 | 12/2015 | Das et al. |

FOREIGN PATENT DOCUMENTS

| | | |
|---|---|---|
| GB | 2307121 A | 5/1997 |
| GB | 2507096 A | 4/2014 |
| GB | 2527637 A | 12/2015 |
| WO | WO0054403 A1 | 9/2000 |
| WO | WO0237686 A2 | 5/2002 |
| WO | 2008067260 A1 | 6/2008 |
| WO | 2015160655 A1 | 10/2015 |

OTHER PUBLICATIONS

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

GB Patent Application No. 1419651.3, Improved Analogue-to-Digital Convertor, filed Nov. 4, 2014, 65 pages.

Combined Search and Examination Report, GB Application No. GB1506258.1, Oct. 21, 2015, 6 pages.

International Search Report and Written Opinion, International Patent Application No. PCT/US2015/025329, mailed Aug. 11, 2015, 9 pages.

International Search Report and Written Opinion, International Patent Application No. PCT/US2015/048633, mailed Dec. 10, 2015, 11 pages.

International Search Report and Written Opinion, International Patent Application No. PCT/US2015/048591, mailed Dec. 10, 2015, 11 pages.

Combined Search and Examination Report, GB Application No. GB1510578.6, Aug. 3, 2015, 3 pages.

International Search Report and Written Opinion, International Application No. PCT/US2015/056357, mailed Jan. 29, 2015, 13 pages.

Combined Search and Examination Report, Application No. GB1514512.1, mailed Feb. 11, 2016, 7 pages.

\* cited by examiner

SYSTEMS AND METHODS FOR GAIN CALIBRATION OF AN AUDIO SIGNAL PATH

FIELD OF DISCLOSURE

The present disclosure relates in general to circuits for audio devices, including without limitation personal audio devices such as wireless telephones and media players, and more specifically, to systems and methods for enhancing a dynamic range of an audio signal path in an audio device while reducing the existence of audio artifacts when switching between dynamic range enhancement modes.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers.

One particular characteristic of a personal audio device which may affect its marketability and desirability is the dynamic range of its audio output signal. Stated simply, the dynamic range is the ratio between the largest and smallest values of the audio output signal. One way to increase dynamic range is to apply a high gain to the power amplifier. However, noise present in an audio output signal may be a generally monotonically increasing function of the gain of amplifier A1, such that any increased dynamic range as a result of a high-gain amplifier may be offset by signal noise which may effectively mask lower-intensity audio signals.

U.S. patent application Ser. No. 14/083,972, filed Nov. 19, 2013, entitled "Enhancement of Dynamic Range of Audio Signal Path," and assigned to the applicant (Cirrus Logic, Inc.) of the present disclosure (the "'972 Application") discloses methods and systems for enhancing the dynamic range of an audio signal path. In the '972 Application, an apparatus for providing an output signal to an audio transducer includes an analog signal path portion, a digital-to-analog converter (DAC), and a control circuit. The analog signal path portion has an audio input for receiving an analog signal, an audio output for providing the output signal, and a selectable analog gain, and may be configured to generate the output signal based on the analog signal and in conformity with the selectable analog gain. The DAC has a selectable digital gain and may be configured to convert a digital audio input signal into the analog signal in conformity with the selectable digital gain. The control circuit may be configured to select the selectable analog gain and select the selectable digital gain in accordance with one or more gain modes based on a magnitude of a signal indicative of the output signal, and may select the selectable analog gain and select the selectable digital gain so as to maintain a constant gain through the overall signal path regardless of the applicable gain mode.

Due to process variations, temperature variations, and/or other variations, the various analog gains of the analog path portion which may be selected as the selectable analog gain may deviate from their desired or ideal values. Accordingly, unless such variation is accounted for and corrected, the actual selectable analog gain applied to an audio signal may differ from that desired, and the overall signal path gain may not remain constant across the one or more gain modes. In addition, it may be desirable to account for and correct for such variation in a manner that is not detectable (e.g., audibly perceived) by an end user of a personal audio device.

SUMMARY

In accordance with the teachings of the present disclosure, one or more disadvantages and problems associated with existing approaches to maintaining a high dynamic range of an audio signal path may be reduced or eliminated.

In accordance with embodiments of the present disclosure, an integrated circuit may include a signal path and a calibration system. The signal path may include a first path portion and a second path portion. The first path portion may include an amplifier having an audio input for receiving an analog input signal, an audio output for providing an output signal, and an analog gain selected from a plurality of analog gains in accordance with a gain mode, and configured to generate the output signal based on the analog input signal and in conformity with the analog gain. The second path portion may have a digital gain selected from a plurality of digital gains in accordance with the gain mode and configured to convert a digital audio input signal into the analog input signal in conformity with the digital gain. The gain mode may be selected from a plurality of gain modes such that for each particular gain mode of the plurality of gain modes, the product of the digital gain associated with the particular gain mode and the analog signal gain associated with the particular gain mode are approximately equal to a fixed path gain. The calibration system may be configured to, during each of one or more calibration phases of the signal path and for each of one or more of the gain modes, measure analog signals at a plurality of nodes of the first path portion, calculate an actual analog gain associated with the gain mode based on the analog signals measured at the plurality of nodes, calculate an error between the fixed path gain and a mathematical product of the actual analog gain associated with the gain mode and the digital gain associated with the gain mode, and modify at least one of the digital gain and the analog gain associated with the gain mode in conformity with the error.

In accordance with these and other embodiments of the present disclosure, a method for calibrating a signal path may be provided. The signal path may include a first path portion comprising an amplifier having an audio input for receiving an analog input signal, an audio output for providing an output signal, and an analog gain selected from a plurality of analog gains in accordance with a gain mode, and configured to generate the output signal based on the analog input signal and in conformity with the analog gain. The signal path may further comprise a second path portion having a digital gain selected from a plurality of digital gains in accordance with the gain mode and configured to convert a digital audio input signal into the analog input signal in conformity with the digital gain. The gain mode may be selected from a plurality of gain modes such that for each particular gain mode of the plurality of gain modes, the product of the digital gain associated with the particular gain mode and the analog signal gain associated with the particular gain mode are approximately equal to a fixed path gain. The method may include, during each of one or more calibration phases of the signal path, measuring analog signals at a plurality of nodes of the first path portion, calculating an actual analog gain associated with the gain mode based on the analog signals measured at the plurality of nodes, calculating an error between the fixed path gain and a mathematical product of the actual analog gain associated with the gain mode and the digital gain associated with the gain mode, and modifying at least one of the digital gain and the analog gain associated with the gain mode in conformity with the error.

In accordance with these and other embodiments of the present disclosure, a personal audio device may include an audio transducer, a signal path, and a calibration system. The audio transducer may be configured to generate sound in accordance with an output signal received by the audio transducer. The signal path may be coupled to the audio transducer, and may comprise a first path portion and a second path portion. The first path portion may include an amplifier having an audio input for receiving an analog input signal, an audio output for providing the output signal, and an analog gain selected from a plurality of analog gains in accordance with a gain mode, and configured to generate the output signal based on the analog input signal and in conformity with the analog gain. The second path portion may have a digital gain selected from a plurality of digital gains in accordance with the gain mode and configured to convert a digital audio input signal into the analog input signal in conformity with the digital gain. The gain mode may be selected from a plurality of gain modes such that for each particular gain mode of the plurality of gain modes, the product of the digital gain associated with the particular gain mode and the analog signal gain associated with the particular gain mode are approximately equal to a fixed path gain. The calibration system may be configured to, during each of one or more calibration phases of the signal path and for each of one or more of the gain modes, measure analog signals at a plurality of nodes of the first path portion, calculate an actual analog gain associated with the gain mode based on the analog signals measured at the plurality of nodes, calculate an error between the fixed path gain and a mathematical product of the actual analog gain associated with the gain mode and the digital gain associated with the gain mode, modify at least one of the digital gain and the analog gain associated with the gain mode in conformity with the error.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may include a signal path having a digital path portion (e.g., an audio compressor) and an analog path portion (e.g., an audio expander). The digital path portion may be configured to receive a digital input signal (e.g., a digital audio signal), apply a selectable digital gain x to the digital input signal, and convert the digital input signal (e.g., via a digital-to-analog converter) to an analog signal in conformity with the selectable digital gain. The analog path portion may be configured to receive the analog signal and apply (e.g., by an analog amplifier) a selectable analog gain k/x to the analog signal to generate an output signal, wherein said output signal may be communicated to a loudspeaker for playback and/or to other circuitry for processing. The numerator k of the selectable analog gain may be a constant defining an overall cumulative gain of the signal path. A control circuit coupled to the signal path may be capable of modifying the selectable digital gain and the selectable analog gain, for example to maximize a dynamic range of the signal path. For example, based on analysis of the output signal or another signal within the signal path indicative of the output signal, the control circuit may select a value for the selectable digital gain and a corresponding value for the selectable analog gain. Thus, for lower magnitudes of the output signal, the control circuit may select a higher selectable digital gain and a lower selectable analog gain, and for higher magnitudes of the output signal, the control circuit may select a lower selectable digital gain and a higher selectable analog gain. Such selectable gains may allow a signal path to increase its dynamic range to lower-magnitude signals, while preventing undesirable effects such as signal clipping for higher-magnitude signals. In operation, the control circuit may also be configured to predict, based on a magnitude of a signal indicative of the output signal, a condition for changing the selectable digital gain and the selectable analog gain, and responsive to predicting the occurrence of the condition, change, at an approximate time in which a zero crossing of the signal indicative of the output signal occurs, the selectable digital gain and the selectable analog gain.

Figure 1:
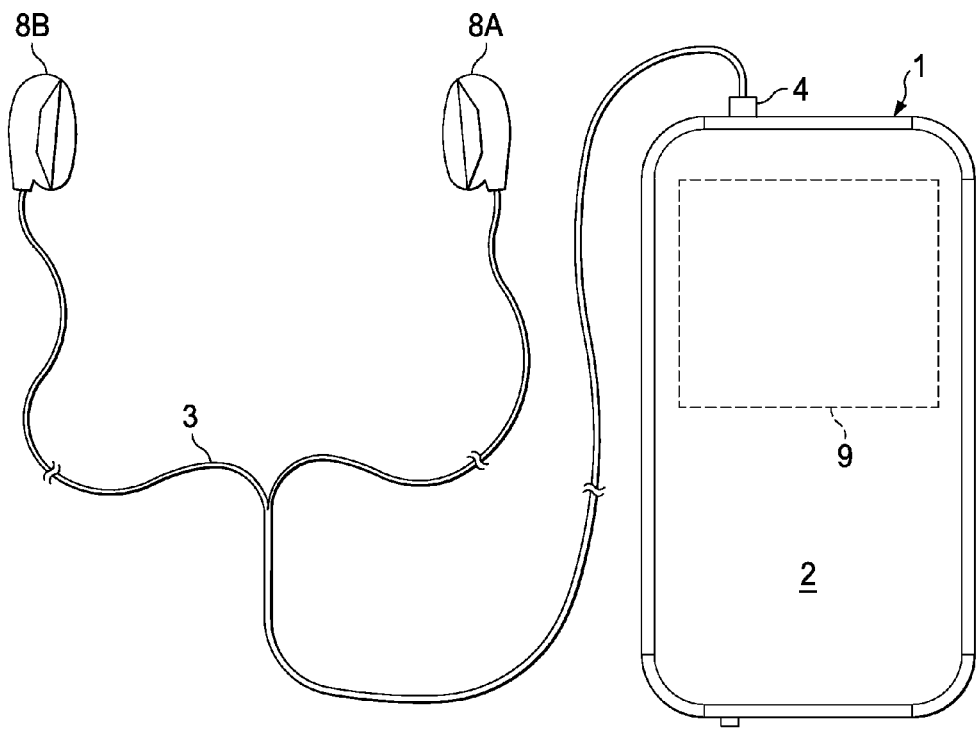
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
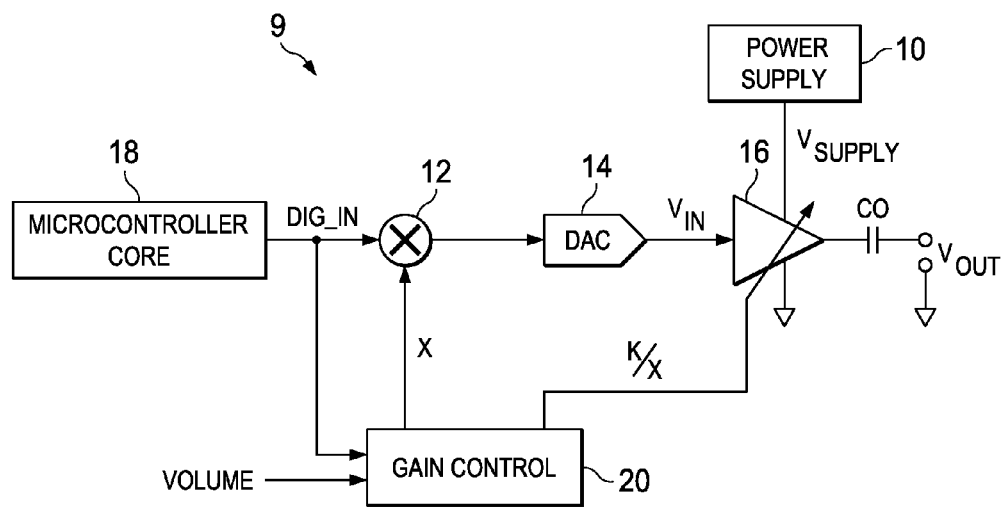
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a gain element 12 to apply a selectable digital gain x selected by gain control circuit 20 to the digital input signal DIG_IN. The amplified digital audio input signal may be communicated to a digital-to-analog converter (DAC) 14, which may convert the digital audio input signal to an analog signal $V_{IN}$. Together, gain element 12 and DAC 14 may be referred to herein as a digital path portion of the signal path from the input node for digital audio input signal DIG_IN to the output node for output voltage signal $V_{OUT}$ depicted in FIG. 2. In the relevant art, gain element 12 and DAC 14 may sometimes be referred to as an audio compressor.

DAC 14 may supply analog signal $V_{IN}$ to an amplifier stage 16 which may amplify or attenuate audio input signal $V_{IN}$ in conformity with a selectable analog gain k/x to provide an audio output signal $V_{OUT}$, which may operate a speaker, headphone transducer, a line level signal output, and/or other suitable output. Amplifier stage 16 may be referred to herein as an analog path portion of the signal path from the input node for digital audio input signal DIG_IN to the output node for output voltage signal $V_{OUT}$ depicted in FIG. 2. In the relevant art, amplifier stage 16 may sometimes be referred to as an audio expander. A capacitor CO may be utilized to couple the output signal to the transducer or line level output, particularly if amplifier stage 16 is operated from a unipolar power supply having a quiescent voltage substantially differing from ground. A power supply 10 may provide the power supply rail inputs of amplifier stage 16.

As shown in FIG. 2, audio IC 9 may include a gain control circuit 20 configured to, based on digital audio input signal DIG_IN, control selectable digital gain x of gain element 12 and a selectable analog gain k/x of amplifier stage 16. In embodiments in which a volume control is present, a volume control signal may be provided from a microcontroller (which may or may not be microcontroller core 18) or other digital control circuit responsive to a user interface, volume knob encoder or program command, or other suitable mechanism.

As an example of the dynamic range enhancement functionality of audio IC 9, when digital audio input signal DIG_IN is at or near zero decibels (0 dB) relative to the full-scale voltage of the digital audio input signal, gain control circuit 20 may select a first digital gain (e.g., $x_1$) for the selectable digital gain and a first analog gain (e.g., $k/x_1$) for the selectable analog gain. However, if the magnitude of digital audio input signal DIG_IN is below a particular predetermined threshold magnitude relative to the full-scale voltage of digital audio input signal DIG_IN (e.g., −20 dB), gain control circuit 20 may select a second digital gain (e.g., $x_2$) greater than the first digital gain (e.g., $x_2>x_1$) for the selectable digital gain and a second analog gain (e.g., $k/x_2$) lesser than the second analog gain (e.g., $k/x_2<k/x_1$) for the selectable analog gain. In each case, the cumulative fixed path gain (e.g., k) of the selectable digital gain and the selectable analog gain may be substantially constant (e.g., the same within manufacturing and/or operating tolerances of audio IC 9). In some embodiments, k may be approximately equal to 1, such that the cumulative path gain is a unity gain. Such modification of digital gain and analog gain may increase the dynamic range of audio IC 9 compared to approaches in which the digital gain and analog gain are static, as it may reduce the noise injected into audio output signal $V_{OUT}$, which noise may be a generally monotonically increasing function of the analog gain of amplifier stage 16. While such noise may be negligible for higher magnitude audio signals (e.g., at or near 0 dB relative to full-scale voltage), the presence of such noise may become noticeable for lower magnitude audio signals (e.g., at or near −20 dB or lower relative to full-scale voltage). By applying a smaller analog gain at amplifier stage 16 for smaller signal magnitudes, the amount of noise injected into audio output signal $V_{OUT}$ may be reduced, while the signal level of audio output signal $V_{OUT}$ may be maintained in accordance with the digital audio input signal DIG_IN through application of a digital gain to gain element 12 inversely proportional to the analog gain.

Figure 3:
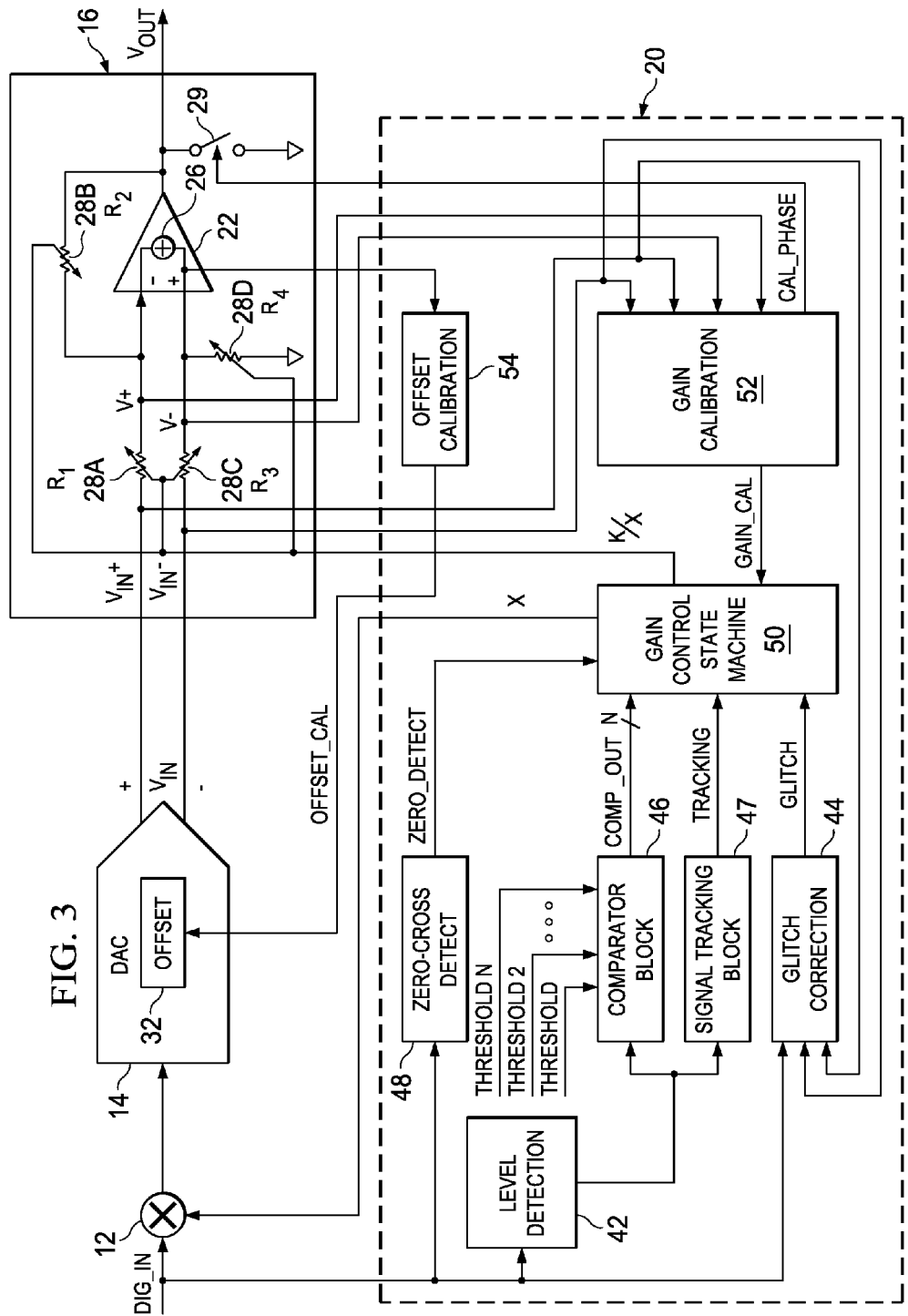
FIG. 3 is a block diagram of selected components of a gain control circuit for use within the audio integrated circuit depicted in FIG. 2, and selected components of an audio integrated circuit which may be coupled to the gain control circuit, in accordance with embodiments of the present disclosure.

FIG. 3 is a block diagram of selected components of an example gain control circuit 20 for use within audio IC 9, and selected components of audio IC 9 which may be coupled to gain control circuit 20, in accordance with embodiments of the present disclosure. As shown in FIG. 3, gain control circuit 20 may include a level detection circuit 42, a comparator block 46, a signal tracking block 47, a zero-cross detection circuit 48, a glitch correction circuit 44, a gain calibration circuit 52, an offset calibration circuit 54, and a gain control state machine 50. Level detection circuit 42 may include any suitable system, device, or apparatus for receiving digital audio input signal DIG_IN (or a derivative thereof), determining a magnitude of such signal, and outputting a signal indicative of such magnitude. Comparator block 46 may compare the output signal of level detection circuit 42 with N predetermined threshold magnitudes, wherein N is a positive integer, and based on such comparison, output a signal COMP_OUT (which may comprise N bits) indicative of whether the desired magnitude of audio output signal $V_{OUT}$ is greater or lesser than each of such predetermined threshold magnitudes. In some embodiments, such predetermined threshold magnitudes may be relative to a full-scale voltage of digital audio input signal DIG_IN and/or audio output signal $V_{OUT}$. In some embodiments, comparator block 46 may implement hysteresis, such that signal COMP_OUT or a bit thereof may only transition if the output signal of level detection block 42 remains above or below a predetermined threshold magnitude for a minimum duration of time (e.g., 0.1 seconds to place any switching artifacts outside the human-perceptible audio range).

Zero-cross detection circuit 48 may include any suitable system, device, or apparatus for detecting the occurrence of a zero crossing of digital audio input signal DIG_IN (or a derivative thereof) and outputting a signal ZERO_DETECT indicating that a zero crossing of such signal has occurred. A zero crossing of a signal may occur when the waveform of such signal crosses a magnitude of zero or crosses another level within a threshold of zero and indicative of a zero crossing (e.g., a low signal level of lower than −70 dB or within a small number of least significant bits of zero).

Signal tracking block 47 may comprise any suitable system, device, or apparatus for tracking a particular parameter of an audio signal, including without limitation a plurality of peaks of such audio signal and/or a signal envelope of such audio signal, and based thereon, generating an output signal TRACKING indicative of such tracked parameter.

Glitch correction circuit 44 may comprise any suitable system, device, or apparatus for correcting for a latency or group delay between the output of gain element 12 and the input of amplifier stage 16. Such glitch correction may account for a change of the selectable digital gain of gain element 12 which requires a latency to propagate to amplifier stage 16 where a corresponding selectable analog gain may be applied. Without such correction, the latency of group delay may cause audio artifacts to appear at the output of the signal path. Accordingly, as shown in FIG. 3, glitch correction circuit 44 may receive analog input signal $V_{IN}$ and the digital audio input signal DIG_IN to determine a latency between such signals and/or a transient response of the signal path between digital audio input signal DIG_IN and analog input signal $V_{IN}$, and based thereon, generate and communicate to gain control state machine 50 a signal GLITCH indicative of such latency and/or transient response. Based on signal GLITCH, gain control state machine 50 may control the application of selectable digital gain x of gain element 12 and a selectable analog gain k/x of amplifier stage 16 in order to reduce or eliminate glitches caused by such latency and/or transient response. In some embodiments, glitch correction circuit 44 may have structure and/or functionality identical or similar to that disclosed in U.S. patent application Ser. No. 14/483,659, filed Sep. 11, 2014, entitled "Systems and Methods for Reduction of Audio Artifacts in an Audio System with Dynamic Range Enhancement," and assigned to the applicant (Cirrus Logic, Inc.) of the present disclosure.

Gain calibration circuit 52 may comprise any suitable system, device, or apparatus for correcting for a non-ideal gain of amplifier stage 16. To illustrate, amplifier stage 16 may comprise an operational amplifier 22 and a plurality of resistors 28 (e.g., 28A-28D) such that the selectable analog gain is set by the resistances $R_1$, $R_2$, $R_3$, and $R_4$ of resistors 28A, 28B, 28C, and 28D, respectively. For example, in the embodiments represented by FIG. 3, resistor 28B may have a variable resistance $R_2$. In such embodiments, resistor 28B may comprise a switched resistor network comprising a resistor string having a plurality of taps each coupled to a corresponding switch. To apply a desired selectable analog gain to amplifier stage 16, such switches may be selectively opened and closed to create an effective resistance $R_2$ between a negative input of operational amplifier 22 and the output of operational amplifier 22, wherein the selectable analog gain of operational amplifier 22 is based on such effective resistance $R_2$. Although FIG. 3 depicts a particular architecture for providing analog gain of amplifier stage 16, other suitable architectures may be applied in accordance with this disclosure.

Due to non-idealities of amplifier stage 16 (e.g., temperature variations, process tolerances, etc.), an actual gain of amplifier stage 16 may differ from that of a desired level of gain determined by gain control state machine 50 and/or an ideal gain calculated based on nominal values of resistances $R_1$, $R_2$, $R_3$, and $R_4$. Accordingly, gain calibration circuit 52 may determine the actual gain of amplifier stage 16 and output a signal GAIN_CAL indicative of such actual gain, and gain control state machine 50 may correct for non-idealities in selecting the selectable digital gain, as described in greater detail below with reference to FIG. 4.

Offset calibration circuit 54 may comprise any suitable system, device, or apparatus for correcting for an offset of amplifier stage 16. To illustrate, operational amplifier 22 may include, due to non-idealities of amplifier stage 16 (e.g., temperature variations, process tolerances, etc.), a slight offset 26 from a desired ground or common mode voltage associated with amplifier stage 16, which may affect signal output $V_{OUT}$. Accordingly, offset calibration circuit 54 may determine the offset 26 of amplifier stage 16 and output a signal OFFSET_CAL, which may be communicated to an offset block 32 of DAC 14 such that DAC 14 may correct for such analog offset.

Gain control state machine 50 may receive signals COMP_OUT, TRACKING, ZERO_DETECT, GLITCH, and/or GAIN_CAL and based on one or more of such signals, generate the selectable digital gain and the selectable analog gain, as described in greater detail elsewhere in this disclosure. For example, when the magnitude of digital audio input signal DIG_IN transitions from above to below a predetermined threshold magnitude (e.g., −24 dB), signal COMP_OUT may indicate such transition and in response, gain control state machine 50 may wait until the occurrence of a zero crossing (as indicated by signal ZERO_DETECT), after which it may cause DAC 14 to increase the selectable digital gain and decrease the selectable audio gain in a similar amount. By changing the selectable digital gain and the selectable audio gain at a zero crossing of digital audio input signal DIG_IN (or a derivative thereof), the change and any auditory artifacts associated with the change may be masked and therefore be unnoticeable or less noticeable to a listener of an audio device including audio IC 9.

As another example, when the sum of the magnitude of digital audio input signal DIG_IN transitions from below to above a predetermined threshold magnitude (e.g., −24 dB), signal COMP_OUT may indicate such transition, and in response gain control state machine 50 may cause DAC 14 to decrease the selectable digital gain and increase the selectable analog gain in a similar amount. However, when transitioning to lower digital gain mode, it may not be desirable to wait for a zero cross of the output signal, as a transition from below to above the predetermined threshold magnitude may almost immediately lead to clipping of the audio signal. Accordingly, it may be desirable to predict whether the magnitude of digital audio input signal DIG_IN is likely to cross such predetermined threshold and switch the selectable digital gain and the selectable analog gain responsive to such prediction at a zero crossing event of the digital audio input signal DIG_IN occurring before crossing of the predetermined threshold by the digital audio input signal DIG_IN. By applying such predictive techniques, gain control block 20 may facilitate switching between gain modes to increase dynamic range while reducing audio artifacts.

Figure 4:
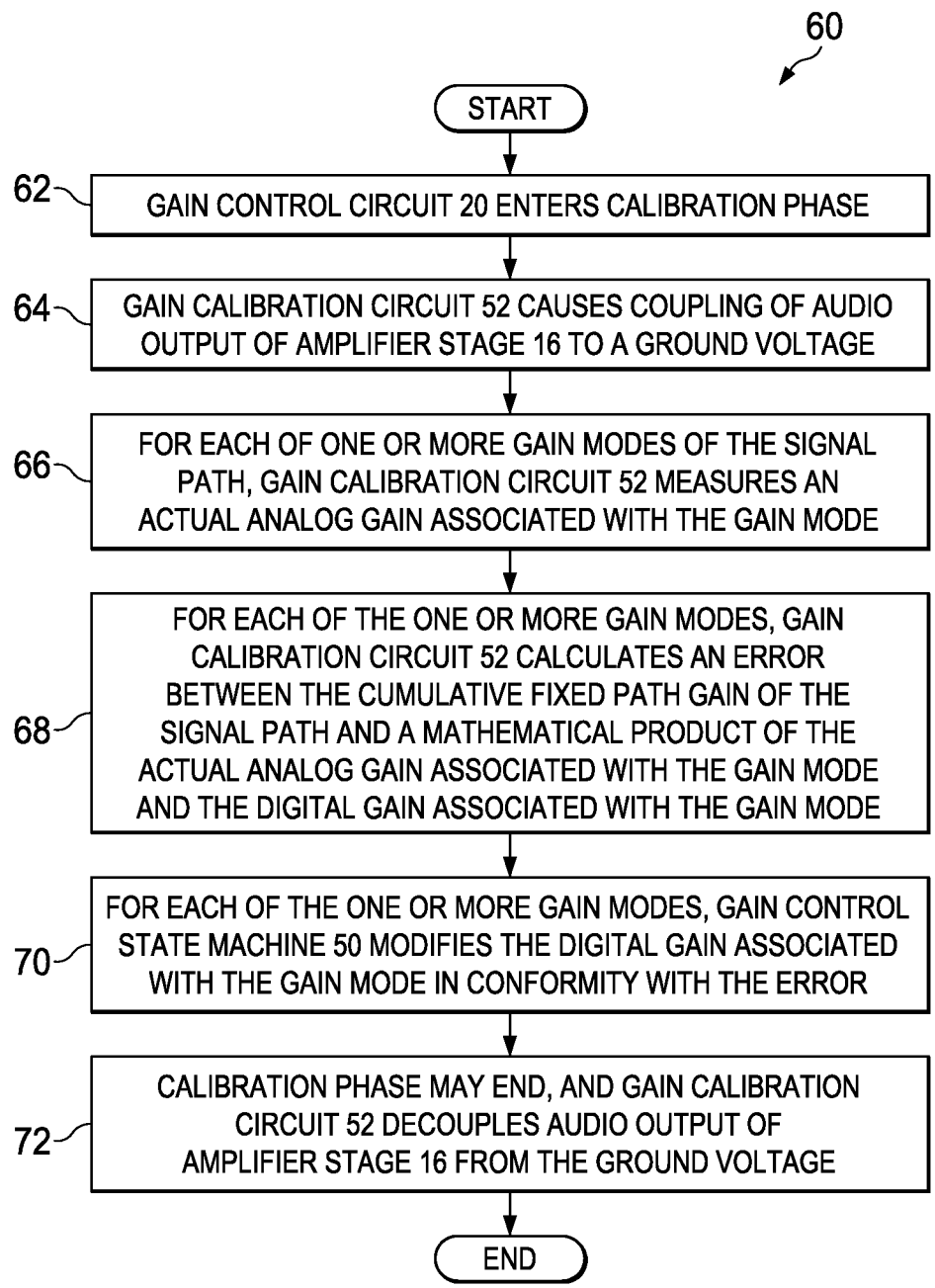
FIG. 4 illustrates a flow chart of an example method for gain calibration of an audio signal path, in accordance with embodiments of the present disclosure.

FIG. 4 illustrates a flow chart of an example method 60 for gain calibration of an audio signal path, in accordance with embodiments of the present disclosure. According to one embodiment, method 60 may begin at step 62. As noted above, teachings of the present disclosure may be implemented in a variety of configurations of audio IC 9. As such, the preferred initialization point for method 60 and the order of the steps comprising method 60 may depend on the implementation chosen.

At step 62, gain control circuit 20 may enter a calibration phase. In some embodiments, one or more calibration phases may occur during factory testing of a signal path, audio IC 9 on which the signal path is located, and/or a device (e.g., personal audio device 1) comprising the signal path. In these and other embodiments, one or more calibration phases may occur after use of a device (e.g., personal audio device 1) by an end user of the device. For example, a calibration phase may occur during a powering on of one or more components of the signal path, a powering off of one or more components of the signal path, a reset of one or more components of the signal path, a coupling of a load to the amplifier, a decoupling of a load from the amplifier, and a calibration operation responsive to a user request to calibrate.

At step 64, responsive to entering the calibration phase, gain calibration circuit 52 may assert a signal CAL_PHASE that activates a switch 29 to couple the audio output of amplifier stage 16 to a ground voltage during the calibration phase. By coupling the audio output to the ground voltage, the calibration operations that follow in the steps below may be audibly imperceptible to a listener of personal audio device 1.

At step 66, gain calibration circuit 52 may, for each of one or more gain modes of the signal path, measure an actual analog gain associated with the gain mode. In some embodiments, gain calibration circuit 52 may measure the actual analog gain by measuring analog input signal $V_{IN}$ and the inputs of operational amplifier 22. As shown in FIG. 3, in embodiments in which amplifier stage 16 has differential input, analog input signal $V_{IN}$ may be equal to the difference between a positive polarity voltage $V_{IN}^+$ and a negative polarity voltage $V_{IN}^-$. The inputs of operational amplifier 22 may have a voltage $V^+$ at the negative input node of operational amplifier 22 and a voltage $V^-$ at the positive input node of operational amplifier 22. With the analog output of amplifier stage 16 coupled to a ground voltage and disabled and/or powered down, the following equations may represent the relationships among the differential analog input voltages of the voltages present at the input nodes of operational amplifier 22:

$$V^+ = [R_2/(R_1+R_2)] \times V_{IN}^+ \quad \text{(eq. 1)}$$

$$V^- = [R_4/(R_3+R_4)] \times V_{IN}^- \quad \text{(eq. 2)}$$

Output signal $V_{OUT}$ (when the analog output of amplifier stage 16 is not coupled to a ground voltage via switch 29) may be given by:

$$V_{OUT} = 0.5 V_{IN}[R_4/(R_3+R_4)](1+R_2/R_1) + 0.5 V_{IN}(R_2/R_1) \quad \text{(eq. 3)}$$

Dividing each side of equation 3 by $V_{IN}$, and substituting equation 2, the gain of amplifier stage 16 may be given by:

$$V_{OUT}/V_{IN} = 0.5(V^-/V_{IN}^-)(1+R_2/R_1) + 0.5[1-(1+R_2/R_1)] \quad \text{(eq. 4)}$$

In accordance with equation 1:

$$(1+R_2/R_1) = V_{IN}^+/(V_{IN}^+ - V^+) \quad \text{(eq. 5)}$$

Substituting equation 5 into equation 4:

$$V_{OUT}/V_{IN} = 0.5(V^-/V_{IN}^-)[V_{IN}^+/(V_{IN}^+ - V^+)] + 0.5\{1 - [V_{IN}^+/(V_{IN}^+ - V^+)]\} \quad \text{(eq. 6)}$$

Thus, the actual analog gain of amplifier stage 16 may be calculated in accordance with equation 6 by measuring analog input signal $V_{IN}$ and the inputs of operational amplifier 22.

In some embodiments, gain calibration circuit 52 may include an analog-to-digital converter for converting analog measurements of analog input signal $V_{IN}$ and analog signals $V^+$ and $V^-$ present at the inputs of operational amplifier 22 to digital representations of such signals. Gain calibration circuit 52 may then calculate the actual analog gain of amplifier stage 16 associated with the given gain mode based on the digital representations of analog input signal $V_{IN}$ and analog signals $V^+$ and $V^-$ present at the inputs of operational amplifier 22.

In other embodiments, the actual analog gain may be calculated by measuring analog input signal $V_{IN}$ and audio output signal $V_{OUT}$, without clamping the audio output of amplifier stage 16.

At step 68, for each of the one or more gain modes, gain calibration circuit 52 may calculate an error between the cumulative fixed path gain of the signal path and a mathematical product of the actual analog gain associated with the gain mode and the digital gain associated with the gain mode, and communicate such error to gain control state machine 50.

At step 70, for each of the one or more gain modes, gain control state machine 50 may modify the digital gain associated with the gain mode in conformity with the error. For example, if an actual analog gain is such that the product of the actual analog gain and digital gain associated with a gain mode is ten percent higher than the desired cumulative fixed path gain of the signal path, gain control state machine 50 may reduce the digital gain associated with the gain mode by ten percent. In these and other embodiments, gain control state machine 50 may modify the analog gain associated with the gain mode in conformity with the error to maintain the desired cumulative fixed path gain of the signal path.

At step 72, after a period of time or the occurrence of some event, the calibration phase may end, and gain calibration circuit 52 may deactivate switch 29 such that the analog output of amplifier stage 16 is decoupled from the ground voltage. After step 72, method 60 may end.

Although FIG. 4 discloses a particular number of steps to be taken with respect to method 60, method 60 may be executed with greater or fewer steps than those depicted in FIG. 4. In addition, although FIG. 4 discloses a certain order of steps to be taken with respect to method 60, the steps comprising method 60 may be completed in any suitable order.

Method 60 may be implemented using gain control circuit 20 or any other system operable to implement method 60. In some embodiments, method 60 may be implemented partially or fully in software and/or firmware embodied in computer-readable media.

Among the advantages of the methods and systems described above are that they may provide a mechanism whereby an analog gain of amplifier stage 16 may be calculated and the audio signal path may be calibrated without the calibration operation being audibly perceptible to a user of personal audio device 1. Using traditional approaches to determining analog gain, one may measure an output of an amplifier stage, meaning the measured value may be perceptible to a listener. However, using the methods and systems disclosed herein, the output of the amplifier stage is disregarded, and signals at other nodes of the amplifier stage may be used to indirectly estimate an analog gain for the amplifier stage.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An integrated circuit, comprising:
   a signal path comprising:
      a first path portion comprising an amplifier having an audio input for receiving an analog input signal, an audio output for providing an output signal, and an analog gain selected from a plurality of analog gains in accordance with a gain mode, and configured to generate the output signal based on the analog input signal and in conformity with the analog gain; and
      a second path portion having a digital gain selected from a plurality of digital gains in accordance with the gain mode and configured to convert a digital audio input signal into the analog input signal in conformity with the digital gain;
      wherein the gain mode is selected from a plurality of gain modes such that for each particular gain mode of the plurality of gain modes, the product of the digital gain associated with the particular gain mode and the analog signal gain associated with the particular gain mode are approximately equal to a fixed path gain; and
   a calibration system configured to, during each of one or more calibration phases of the signal path, for each of one or more of the gain modes:
      measure analog signals at a plurality of nodes of the first path portion;
      calculate an actual analog gain associated with the gain mode based on the analog signals measured at the plurality of nodes;
      calculate an error between the fixed path gain and a mathematical product of the actual analog gain associated with the gain mode and the digital gain associated with the gain mode; and
      modify at least one of the digital gain and the analog gain associated with the gain mode in conformity with the error.

2. The integrated circuit of claim 1, wherein:
   the calibration circuit is further configured to, during each of one or more calibration phases of the signal path, clamp the audio output to a ground voltage; and
   wherein the analog signals comprise signals present at inputs of an operational amplifier integral to the amplifier.

3. The integrated circuit of claim 2, further wherein the calibration system calculates the actual analog gain associated with the gain mode by:
   converting analog measurements of the analog input signal and the analog signals present at inputs of the operational amplifier to digital representations of the analog input signal and the analog signals present at inputs of the operational amplifier; and
   calculating the actual analog gain associated with the gain mode based on the digital representations of the analog input signal and the analog signals present at inputs of the operational amplifier.

4. The integrated circuit of claim 3, wherein the integrated circuit further comprises an analog-to-digital converter to convert analog measurements of the analog input signal and the analog signals present at inputs of the operational amplifier to digital representations of the analog input signal and the analog signals present at inputs of the operational amplifier.

5. The integrated circuit of claim 1, wherein one of the calibration phases occurs during factory testing of the signal path.

6. The integrated circuit of claim 5, wherein another one of the calibration phases occurs after use of a device comprising the signal path by an end user of the device.

7. The integrated circuit of claim 1, wherein at least one of the calibration phases occurs during one of: a powering on of one or more components of the signal path, a powering off of one or more components of the signal path, a reset of one or more components of the signal path, a coupling of a load to the amplifier, a decoupling of a load from the amplifier, and a calibration operation responsive to a user request to calibrate.

8. The integrated circuit of claim 1, wherein the analog signals comprise the analog input signal generated by the second path portion and the audio output signal.

9. A method for calibrating a signal path, wherein the signal path comprises a first path portion comprising an amplifier having an audio input for receiving an analog input signal, an audio output for providing an output signal, and an analog gain selected from a plurality of analog gains in accordance with a gain mode, and configured to generate the output signal based on the analog input signal and in conformity with the analog gain, wherein the signal path further comprises a second path portion having a digital gain selected from a plurality of digital gains in accordance with the gain mode and configured to convert a digital audio input signal into the analog input signal in conformity with the digital gain, and wherein the gain mode is selected from a plurality of gain modes such that for each particular gain mode of the plurality of gain modes, the product of the digital gain associated with the particular gain mode and the analog signal gain associated with the particular gain mode are approximately equal to a fixed path gain, wherein the method comprises, during each of one or more calibration phases of the signal path and for each of one or more of the gain modes:
   measuring analog signals at a plurality of nodes of the first path portion;
   calculating an actual analog gain associated with the gain mode based on the analog signals measured at the plurality of nodes;
   calculating an error between the fixed path gain and a mathematical product of the actual analog gain associated with the gain mode and the digital gain associated with the gain mode; and
   modifying at least one of the digital gain and the analog gain associated with the gain mode in conformity with the error.

10. The method of claim 9, further comprising, during each of one or more calibration phases of the signal path, clamping the audio output to a ground voltage, and wherein the analog signals comprise signals present at inputs of an operational amplifier integral to the amplifier.

11. The method of claim 10, wherein measuring the actual analog gain associated with the gain mode comprises:
   converting analog measurements of the analog input signal and the analog signals present at inputs of the operational amplifier to digital representations of the analog input signal and the analog signals present at inputs of the operational amplifier; and
   calculating the actual analog gain associated with the gain mode based on the digital representations of the analog input signal and the analog signals present at inputs of the operational amplifier.

12. The method of claim 11, wherein converting analog measurements of the analog input signal and the analog signals present at inputs of the operational amplifier to digital representations of the analog input signal and the analog signals present at inputs of the operational amplifier comprises converting the analog measurements with an analog-to-digital converter.

13. The method of claim 9, wherein one of the calibration phases occurs during factory testing of the signal path.

14. The method of claim 13, wherein another one of the calibration phases occurs after use of a device comprising the signal path by an end user of the device.

15. The method of claim 9, wherein at least one of the calibration phases occurs during one of: a powering on of one or more components of the signal path, a powering off of one or more components of the signal path, a reset of one or more components of the signal path, a coupling of a load to the amplifier, a decoupling of a load from the amplifier, and a calibration operation responsive to a user request to calibrate.

16. The method of claim 9, wherein the analog signals comprise the analog input signal generated by the second path portion and the audio output signal.

17. A personal audio device comprising:
an audio transducer configured to generate sound in accordance with an output signal received by the audio transducer;
a signal path coupled to the audio transducer, wherein the signal path comprises:
a first path portion comprising an amplifier having an audio input for receiving an analog input signal, an audio output for providing the output signal, and an analog gain selected from a plurality of analog gains in accordance with a gain mode, and configured to generate the output signal based on the analog input signal and in conformity with the analog gain; and
a second path portion having a digital gain selected from a plurality of digital gains in accordance with the gain mode and configured to convert a digital audio input signal into the analog input signal in conformity with the digital gain;
wherein the gain mode is selected from a plurality of gain modes such that for each particular gain mode of the plurality of gain modes, the product of the digital gain associated with the particular gain mode and the analog signal gain associated with the particular gain mode are approximately equal to a fixed path gain; and
a calibration system configured to, during each of one or more calibration phases of the signal path, for each of one or more of the gain modes:
measure analog signals at a plurality of nodes of the first path portion;
calculate an actual analog gain associated with the gain mode based on the analog signals measured at the plurality of nodes;
calculate an error between the fixed path gain and a mathematical product of the actual analog gain associated with the gain mode and the digital gain associated with the gain mode; and
modify at least one of the digital gain and the analog gain associated with the gain mode in conformity with the error.

18. The personal audio device of claim 17, wherein:
the calibration circuit is further configured to, during each of one or more calibration phases of the signal path, clamp the audio output to a ground voltage; and
wherein the analog signals comprise signals present at inputs of an operational amplifier integral to the amplifier.

19. The personal audio device of claim 18, further wherein the calibration system measures the actual analog gain associated with the gain mode by:
converting analog measurements of the analog input signal and the analog signals present at inputs of the operational amplifier to digital representations of the analog input signal and the analog signals present at inputs of the operational amplifier; and
calculating the actual analog gain associated with the gain mode based on the digital representations of the analog input signal and the analog signals present at inputs of the operational amplifier.

20. The personal audio device of claim 19, wherein the integrated circuit further comprises an analog-to-digital converter to convert analog measurements of the analog input signal and the analog signals present at inputs of the operational amplifier to digital representations of the analog input signal and the analog signals present at inputs of the operational amplifier.

21. The personal audio device of claim 17, wherein one of the calibration phases occurs during factory testing of the signal path.

22. The personal audio device of claim 21, wherein another one of the calibration phases occurs after use of the personal audio device by an end user of the personal audio device.

23. The personal audio device of claim 17, wherein at least one of the calibration phases occurs during one of: a powering on of one or more components of the signal path, a powering off of one or more components of the signal path, a reset of one or more components of the signal path, a coupling of a load to the amplifier, a decoupling of a load from the amplifier, and a calibration operation responsive to a user request to calibrate.

24. The personal audio device of claim 17, wherein the analog signals comprise the analog input signal generated by the second path portion and the audio output signal.

* * * * *